US006087762A

United States Patent [19]

Corbett, III et al.

[11] Patent Number: 6,087,762

[45] Date of Patent: Jul. 11, 2000

[54] ULTRASOUND TRANSCEIVER AND METHOD FOR PRODUCING THE SAME

[75] Inventors: Scott S. Corbett, III, Portland, Oreg.; Thomas R. Clary, Issaquah; John P. Yarno, Woodinville, both of Wash.

[73] Assignee: MicroSound Systems, Inc., Snoqualmie, Wash.

[21] Appl. No.: 09/167,515

[22] Filed: Oct. 6, 1998

Related U.S. Application Data

[62] Division of application No. 08/738,611, Oct. 28, 1996, Pat. No. 5,855,049.

[51] Int. Cl.[7] .................... H01L 41/08

[52] U.S. Cl. .................... 310/334; 310/363; 310/367

[58] Field of Search .................... 310/327, 334–337, 310/345, 363, 364, 366

[56] References Cited

U.S. PATENT DOCUMENTS

| | | | |
|---|---|---|---|
| Re. 35,011 | 8/1995 | Wersing et al. | 310/334 |
| 3,995,179 | 11/1976 | Flournoy et al. | 310/8.2 |
| 4,434,384 | 2/1984 | Dunnrowicz et al. | 310/325 |
| 4,611,372 | 9/1986 | Enjoji et al. | 29/25.35 |
| 4,616,152 | 10/1986 | Saito et al. | 310/334 |
| 4,638,468 | 1/1987 | Francis | 310/334 X |
| 4,656,384 | 4/1987 | Magori | 310/334 |
| 4,676,106 | 6/1987 | Nagal et al. | 310/334 X |
| 4,747,192 | 5/1988 | Rokurota | 29/25.35 |
| 4,751,420 | 6/1988 | Gebhardt et al. | 310/327 |
| 4,755,708 | 7/1988 | Granz et al. | 310/334 |
| 4,900,892 | 2/1990 | Baeuerle et al. | 219/121.85 |
| 5,091,893 | 2/1992 | Smith et al. | 367/153 |
| 5,267,221 | 11/1993 | Miller et al. | 367/140 |
| 5,297,553 | 3/1994 | Sliwa, Jr. et al. | 128/662.03 |
| 5,311,095 | 5/1994 | Smith et al. | 310/334 |
| 5,329,496 | 7/1994 | Smith | 367/140 |
| 5,329,498 | 7/1994 | Greenstein | 367/155 |
| 5,381,385 | 1/1995 | Greenstein | 367/140 |
| 5,406,163 | 4/1995 | Carson et al. | 310/334 |
| 5,457,863 | 10/1995 | Thomas, III et al. | 29/25.35 |
| 5,460,180 | 10/1995 | Klepper et al. | 128/661.01 |
| 5,490,512 | 2/1996 | Kwon et al. | 128/661.01 |
| 5,493,541 | 2/1996 | Snyder | 367/155 |
| 5,559,388 | 9/1996 | Lorraine et al. | 310/334 |
| 5,592,730 | 1/1997 | Greenstein et al. | 29/594 |
| 5,629,578 | 5/1997 | Winzer et al. | 310/334 |
| 5,629,906 | 5/1997 | Sudol et al. | 367/162 |
| 5,644,085 | 7/1997 | Lorraine et al. | 73/641 |
| 5,648,941 | 7/1997 | King | 367/176 |
| 5,648,942 | 7/1997 | Kunkel, III | 367/176 |
| 5,740,546 | 4/1998 | Corl et al. | 310/334 X |
| 5,920,972 | 7/1999 | Palczewska et al. | 310/334 X |

*Primary Examiner*—Mark O. Budd
*Attorney, Agent, or Firm*—Timothy E. Siegel

[57] ABSTRACT

An improved ultrasound transceiver array for permitting improved imaging is taught. The array may be either a two dimensional array for volumetric imaging or a one dimensional array of elements shaped to permit a more precise beam focus for finer resolution imaging. An Nd:YAG laser is used to machine a workpiece from both ends to produce kerfs which taper inwardly from the transceiving side of the array thereby permitting a stronger ultrasound signal and clearer imaging.

5 Claims, 15 Drawing Sheets

ULTRASOUND TRANSCEIVER AND METHOD FOR PRODUCING THE SAME

This application is a Division of Ser. No. 08/738,611 filed Oct. 28, 1996 U.S. Pat. No. 5,855,049.

TECHNICAL FIELD

The present invention is an ultrasound transceiver.

BACKGROUND OF THE INVENTION

Ultrasound imaging devices have become an important part of medical technology. The most commonly familiar applications for these devices are fetal imaging and cardiac imaging. The transceiver of an ultrasound imaging system is typically housed in a probe that is placed over a portion of the imaging subject's body.

An ultrasound transceiver is generally an array of piezoelectric elements. A pulse of electricity applied to ultrasound material will physically perturb it, producing a sound wave. In reverse, a sound wave striking ultrasound material will create a pulse of electricity. In an ultrasound imaging system, electrical driver circuitry perturbs the ultrasound elements with pulses of electricity. The ultrasound beam thus created reflects from the tissue of the imaging subject and returns to the transceiver, creating an "echo" signal. This signal is sampled to produce a time stream of data. The time at which any particular sample is collected is proportional to the distance (i.e. range) from the transceiver to the tissue represented by the sample.

Typically, an ultrasound array is electronically focused and steered. This means that the beam direction is determined by setting the amplification and relative phase relationship of each piezoelectric element. Because a present day ultrasound transceiver is typically a one dimensional, linear array of elements, the beam can only be steered in one angular dimension, thereby defining a single scan plane and constraining the data collection to a 2-dimensional cut as described above. If the beam could be steered in two angular dimensions, it would be possible to gather data in two angular dimensions and in range, thereby describing a volumetric portion of the imaging subject rather than a cut. This data could be displayed holographically, as a false color map or as a two dimensional image that would be rotatable in three dimensions.

A transceiver that is electronically steerable in two dimensions must include a two dimensional array of individually controllable elements. A number of problems present themselves in the construction of such an array. First, there is the problem of constructing the elements themselves. One dimensional arrays have traditionally been produced by starting with a solid piece of polarized piezoelectric material and forming individual linear elements by sawing cuts (referred to as "kerfs" in the micromachining field) into this material with a dicing saw. This process generally is too destructive for the production of a two dimensional array. Production using an excimer laser has been tried, but the problems of focusing and time-controlling this type of laser proved so great that only a limited success was achieved.

In addition, to operate correctly, the piezoelectric material of each element must be polarized. It is far more economical and more effective to begin with a solid piece of polarized dielectric material and then machine it without disturbing the polarization. The heat produced by machining with an excimer laser tends to destroy the polarization of the piezoelectric material.

A problem shared by efforts to construct such an array with virtually any sort of energy beam is that the kerfs tend to have a v-shaped cross section. Because the elements are optimally spaced $\lambda/2$ apart, where $\lambda$ is the wavelength of the transmitted ultrasound, the v-shaped kerfs deprive the user of part of the potential maximum $\lambda^2/4$ surface area of each element. This forces the use of a larger transmit voltage pulse for the production of the same volume of ultrasound per element and reduces the receive sensitivity of each element.

The problem of connecting each piezoelectric element of an array to driver and amplifier circuitry is also a challenge. A typical ultrasound frequency is 5 MHz, which is equivalent to a wavelength of 300 $\mu$m and necessitates a two dimensional element with a transceiving surface of 150 $\mu$m square. Because of this small element cross section, each element presents a high impedance to the electrodes that are placed across it. The longer the electrical leads, the more transmission line problems, such as reflection and cross-talk, will be encountered. In addition, it is a challenge to simply extend a lead to each element because in a sizable two dimensional array, the path of many leads must intersect.

SUMMARY OF THE INVENTION

The present invention is an ultrasound transceiver array having piezoelectric elements which taper inwardly from the transceiver surface to the surface which is supported by an interconnect substrate. This structure permits a greater transceiver surface area for each element. The method of producing an ultrasound transceiver with this type of structure is also a part of this invention.

Another aspect of the present invention is a method of making an ultrasound transceiver by machining a piezoelectric substrate with a Nd:YAG laser. The precisely focused beam provided by such a device permits exact machining. It is an advantage of this method that the piezoelectric substrate need not be depolarized during the machining process. In one embodiment of this aspect of the invention, the laser is used to form non-rectilinear elements for the array.

A further aspect of the present invention is an ultrasound sensor in which an anisotropically conducting, acoustically absorptive layer connects the piezoelectric elements with a structure bearing an array of electrically conductive elements. In one embodiment of this invention, the structure is an integrated circuit having an amplifier for each transceiver element. In a further aspect of the present invention the ultrasound transceiver array is directly connected to an integrated circuit.

Additional objects and advantages of this invention will be apparent from the following detailed description of preferred embodiments thereof which proceeds with reference to the accompanying drawings.

DETAILED DESCRIPTION OF THE PREFERRED EMBODIMENTS

Figure 1:
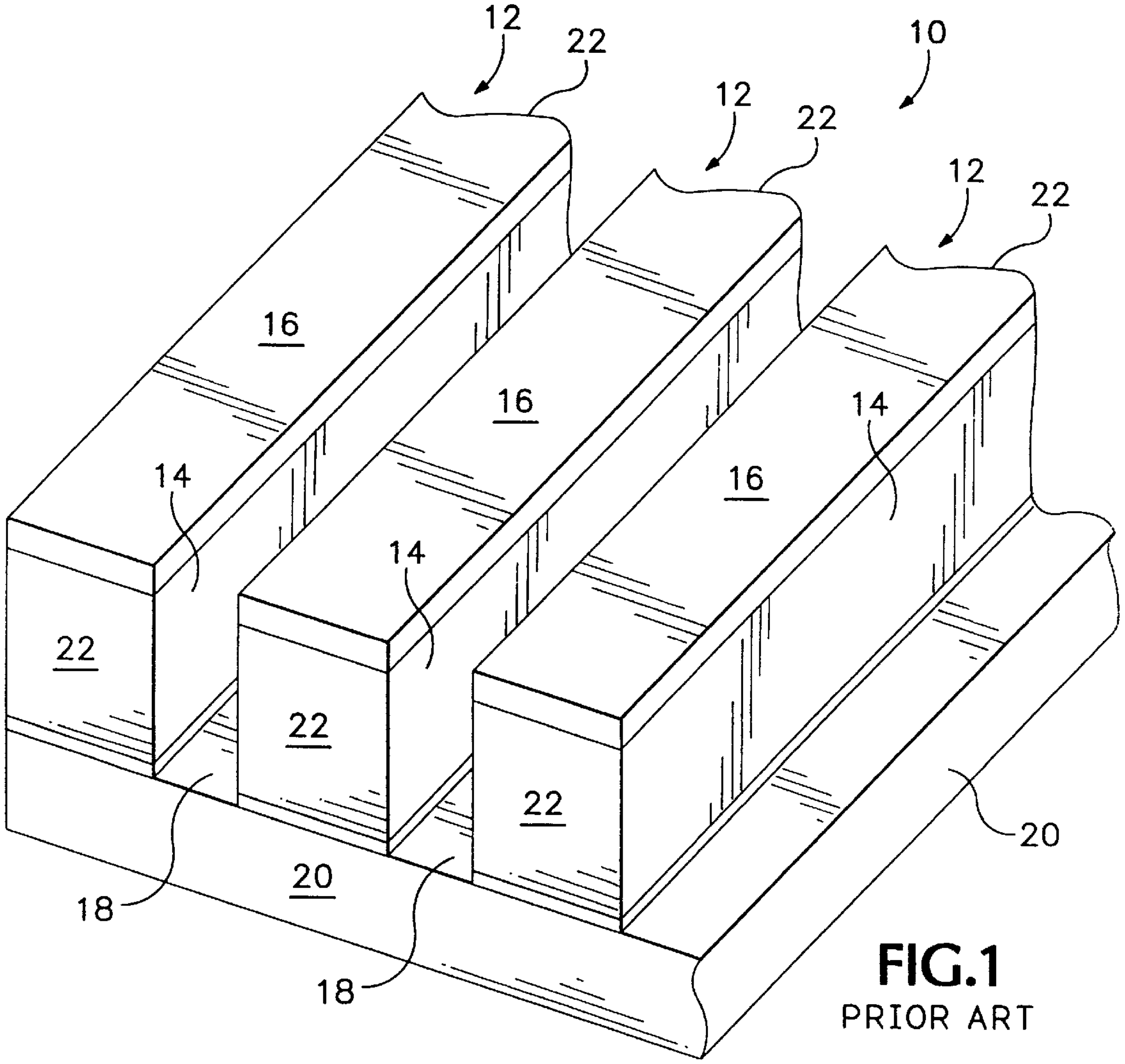
FIG.1 PRIOR ART
FIG. 1 is a greatly expanded isometric drawing of a prior art ultrasound transceiver.

FIG. 1 shows a prior art one dimensional ultrasound transceiver array 10. Linear transceiver elements 12, each comprising a linear piezoelectric motor 14 and a linear transceiving layer 16, are spaced apart by linear kerfs 18 and supported by acoustically absorptive backing 20. Kerfs 18 may be produced by using a dicing saw and the electrical connections needed to drive array 10 may be made on side surfaces 22 of elements 12. Unfortunately, ultrasound sensor array 10 can be electronically steered in one dimension only.

Figure 2A:
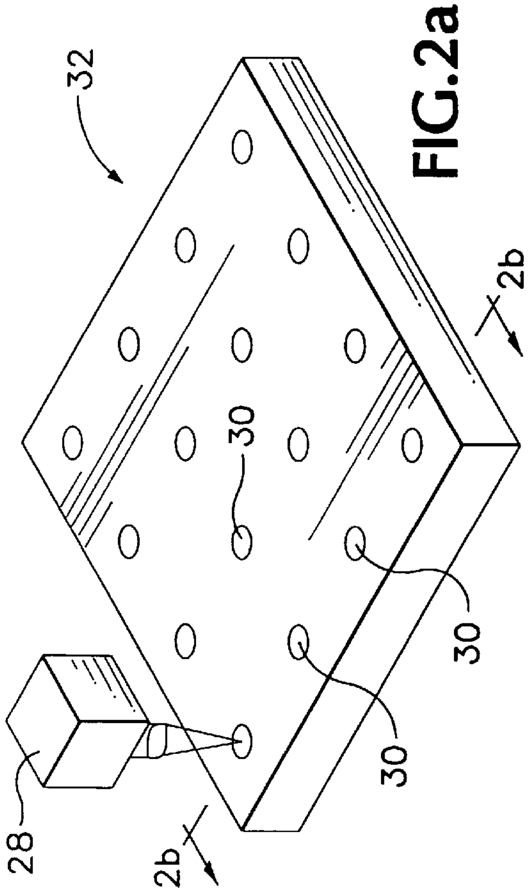
FIG. 2*a* is a greatly expanded isometric drawing of the structure resulting from a first step in the production of an ultrasound transceiver according to the present invention.
Figure 2B:
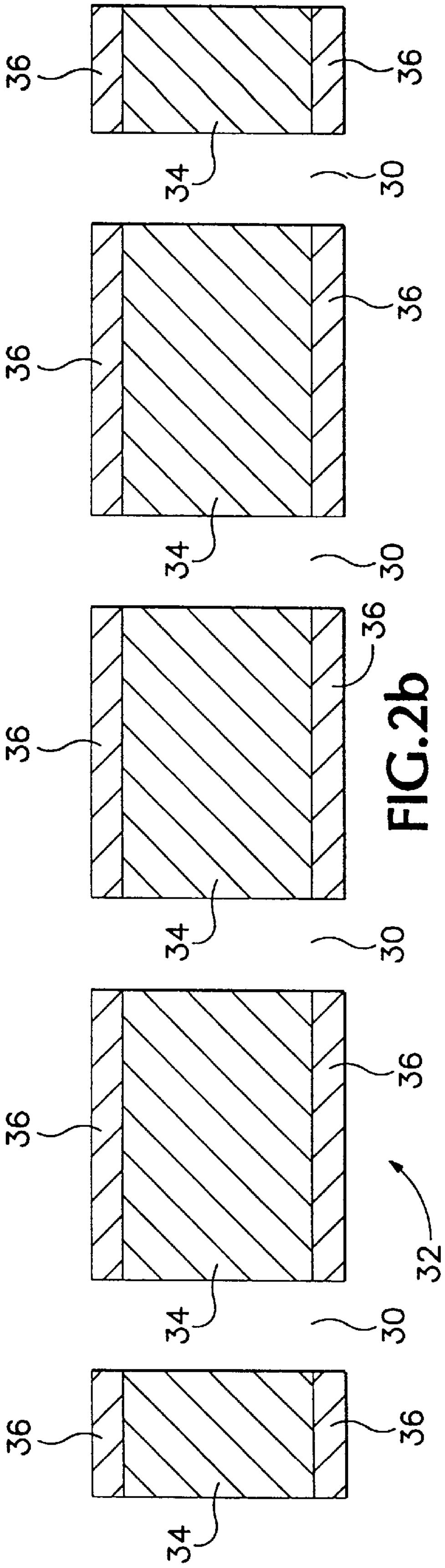
FIG. 2*b* is a greatly expanded cross-sectional side view of the structure of FIG. 2*a*.

FIGS. 2*a* and 2*b* show the first step in the production of a piezoelectric transducer according to the present invention. A frequency quadrupled Nd:YAG laser 28, which emits light having an ultraviolet wavelength of 266 mm, is used to drill a set of open vias 30 through a workpiece 32 comprising a polarized slab of piezoelectric ceramic material 34 plated with a metal layer 36. Although other types of laser or energy beams could be used for this purpose an Nd:YAG laser is virtually an optimal tool because it can be precisely focused and controlled over a wide range of power and pulse repetition rates. The comparatively short 266 nm wavelength of a frequency quadrupled Nd:YAG laser is ideal for the fine machining required in the operations described here. An Nd:YAG laser that is not frequency multiplied or whose frequency is multiplied by a factor other than four may nevertheless be of utility in the present invention. Frequency quadrupled Nd:YAG laser 28 may be controlled to directly ablate the substrate, minimizing heating of the adjacent surface material. Heating can degrade or destroy the polarization of the substrate, necessitating that the piezoelectric material be polarized subsequent to being machined. The highly irregular shape of the material after machining makes this operation difficult, although in the preferred embodiments it is possible due to the electrodes provided. During the machining operations described here, frequency quadrupled Nd:YAG laser 28 is carefully controlled so that it does not heat workpiece 32 above the Curie temperature, which would depolarize workpiece 32.

Figure 3A:
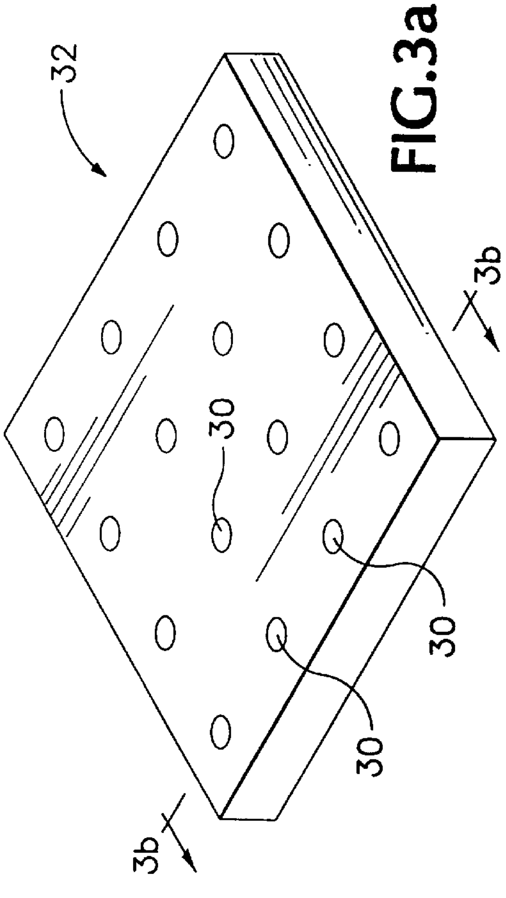
FIG. 3*a* is a greatly expanded isometric drawing of the structure resulting from a second step in the production of an ultrasound transceiver according to the present invention.
Figure 3B:
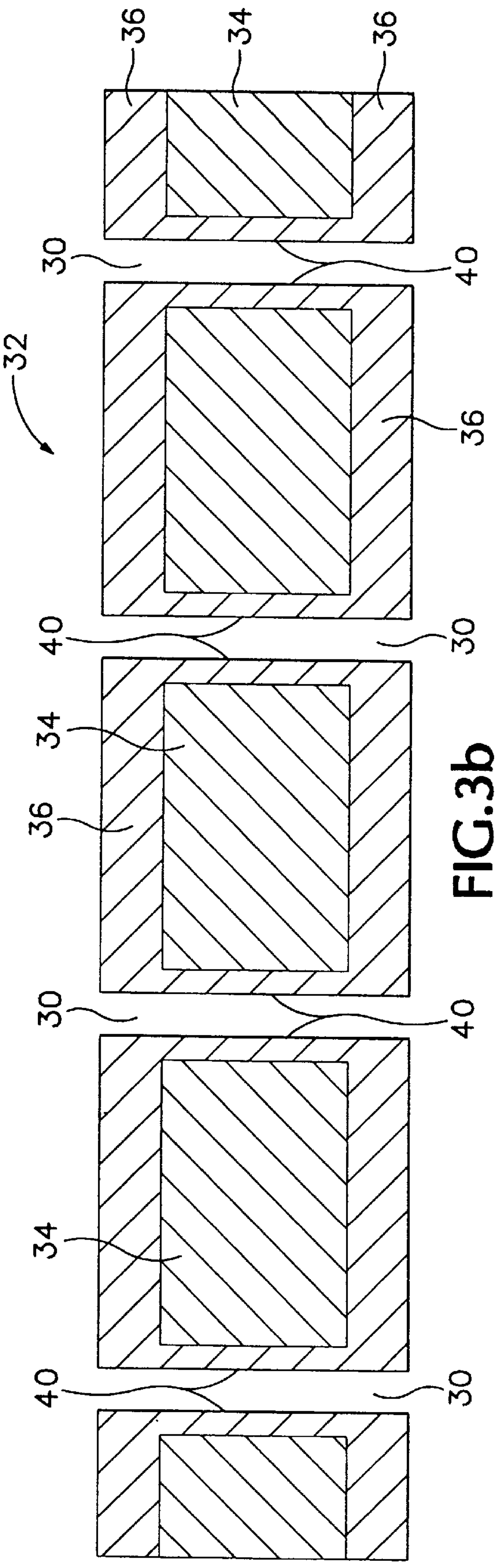
FIG. 3*b* is a greatly expanded cross-sectional side view of the structure of FIG. 3*a*.
Figure 4A:
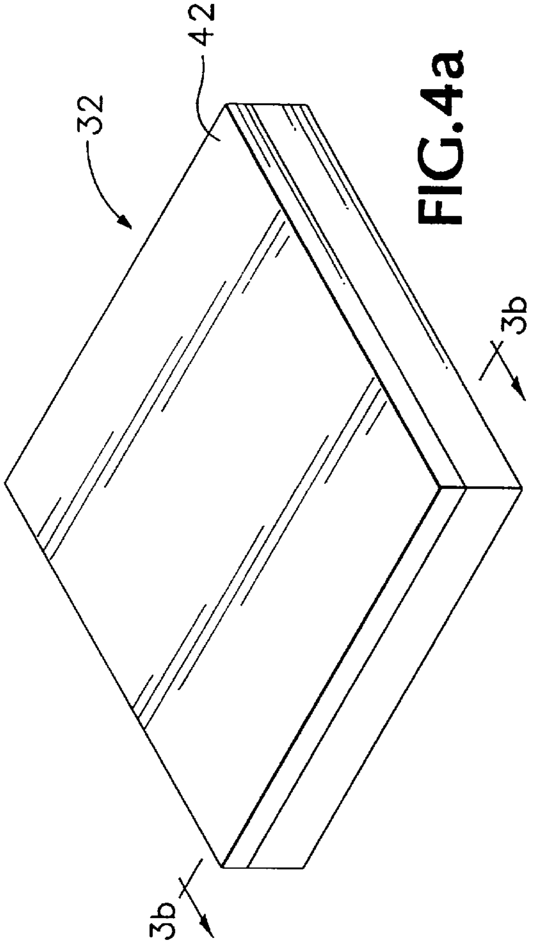
FIG. 4*a* is a greatly expanded isometric drawing of the structure resulting from a third step in the production of an ultrasound transceiver according to the present invention.
Figure 4B:
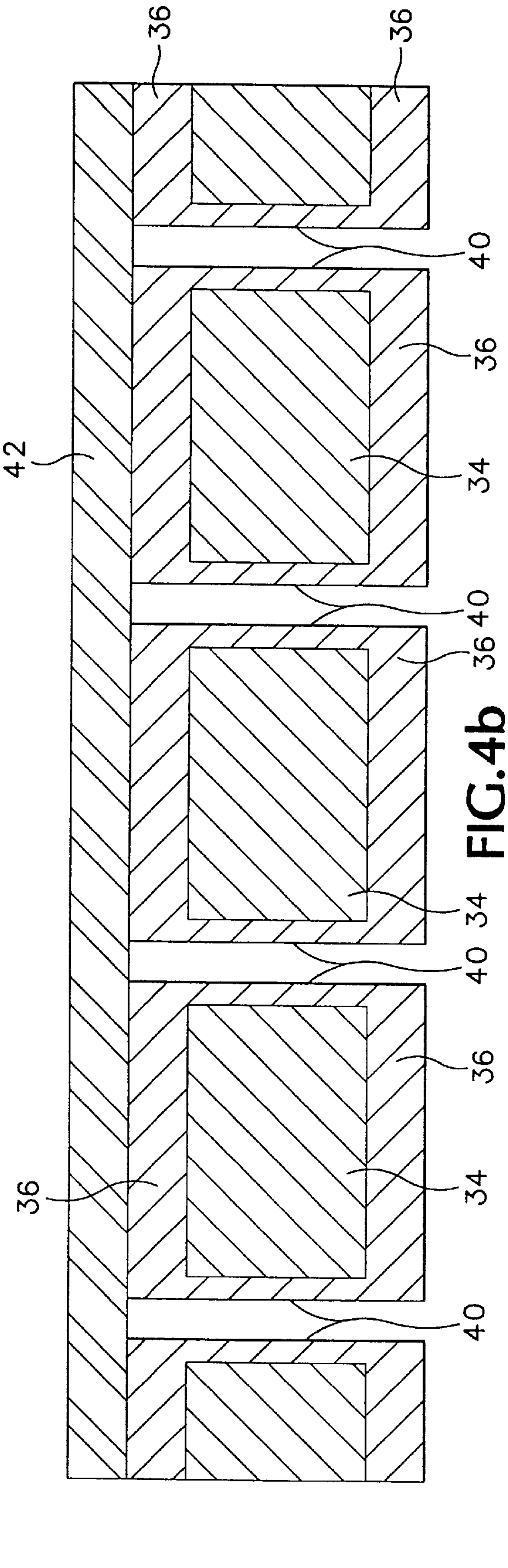
FIG. 4*b* is a greatly expanded cross-sectional side view of the structure of FIG. 4*a*.

In the next step, shown in FIGS. 3*a* and 3*b*, workpiece 32 is metal plated, adding to the thickness of metal layer 36 and forming a plated via 40 out of open via 30. Whether plated via 40 is entirely filled with conductive metal or remains open makes no difference to the process. Then (FIGS. 4*a* and 4*b*) a transceiving layer 42 of material having acoustic characteristics optimized to allow maximum transmission of acoustic energy (i.e. an acoustic matching layer) is adhered to ceramic material 34. The acoustically matching nature of transceiving layer 42 prevents acoustic reflections at the boundary of transceiving layer 42 and metal layer 36.

Figure 5A:
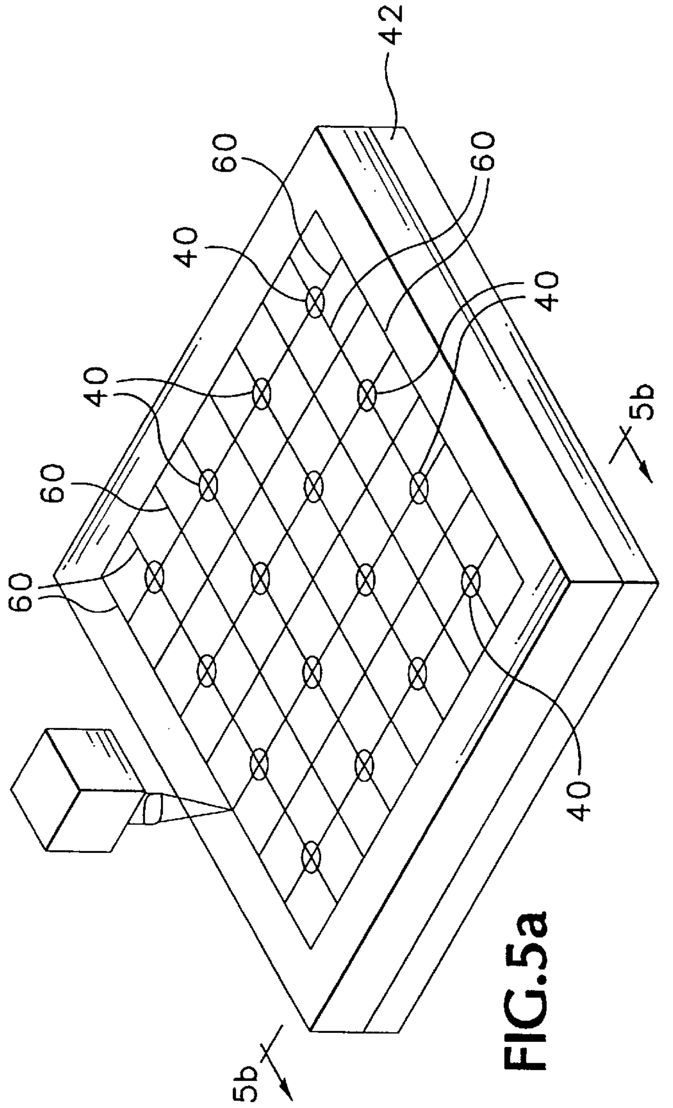
FIG. 5*a* is a greatly expanded isometric drawing of the structure resulting from a fourth step in the production of an ultrasound transceiver according to the present invention.
Figure 5B:
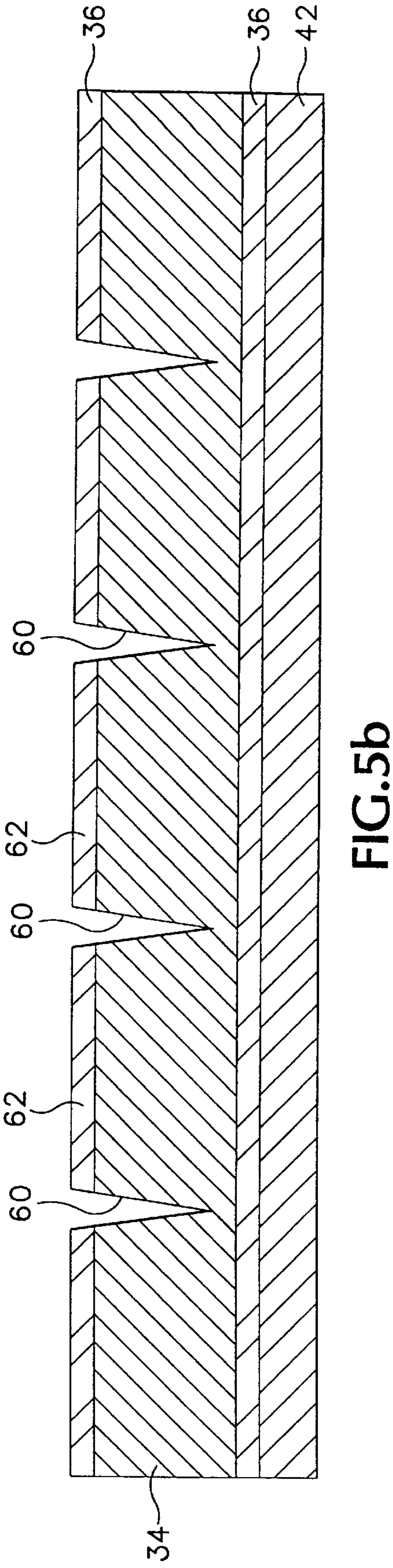
FIG. 5*b* is a greatly expanded cross-sectional side view of the structure of FIG. 3*a*.
Figure 6A:
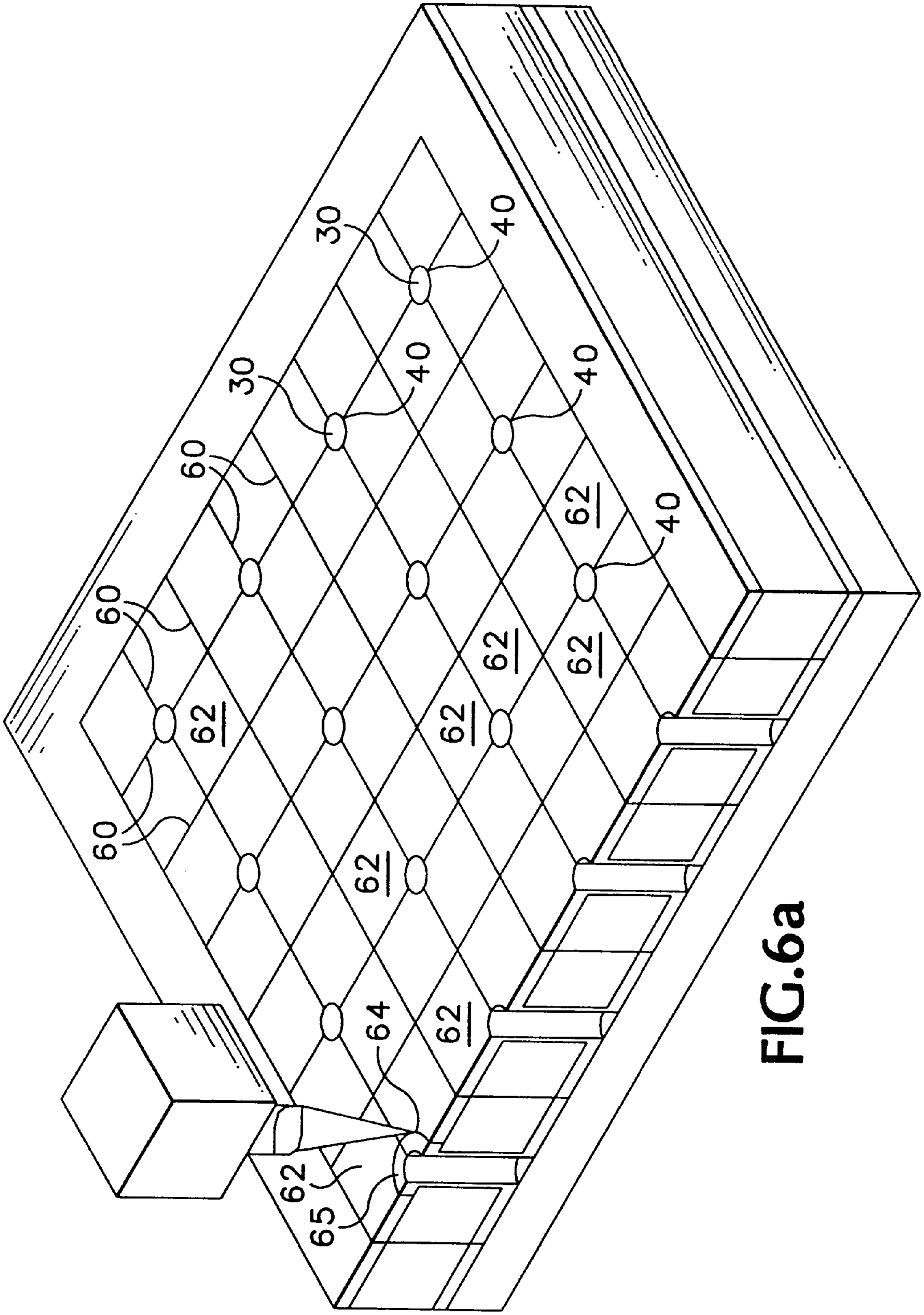
FIG. 6*a* is a greatly expanded isometric drawing of the structure resulting from a fifth step in the production of an ultrasound transceiver according to the present invention.
Figure 6B:
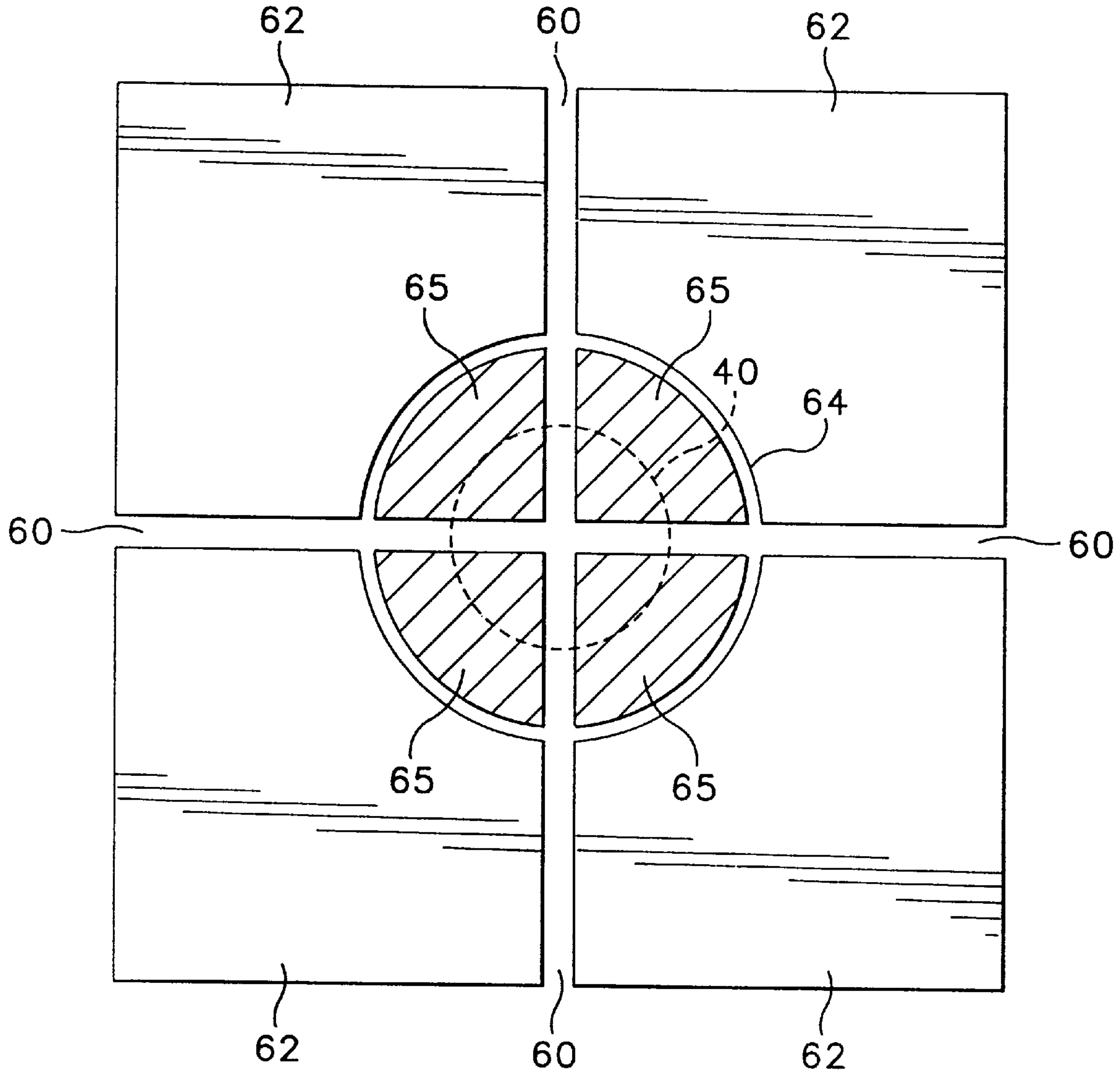
FIG. 6*b* is a greatly expanded top view of the structure of FIG. 3*a*.

As shown in FIGS. 5*a* and 5*b*, frequency quadrupled Nd:YAG laser 28 is used to form a set of kerfs 60 in workpiece 32, thereby dividing metal layer 36 into a set of electrical signal electrodes 62 and each plated via into four quarter-parts. At this point, each comer of each signal electrode 62 is still connected to a quarter-part of a plated via 40. A series of isolation cuts 64 (FIGS. 6*a* and 6*b*) are formed by frequency quadrupled Nd:YAG laser 28 to electrically isolate each quarter-part of a plated via 40 from the adjoining signal electrode 62. The plated via quarter-part, which is now isolated from signal electrode 62 forms a grounding connector 65.

Figure 7:
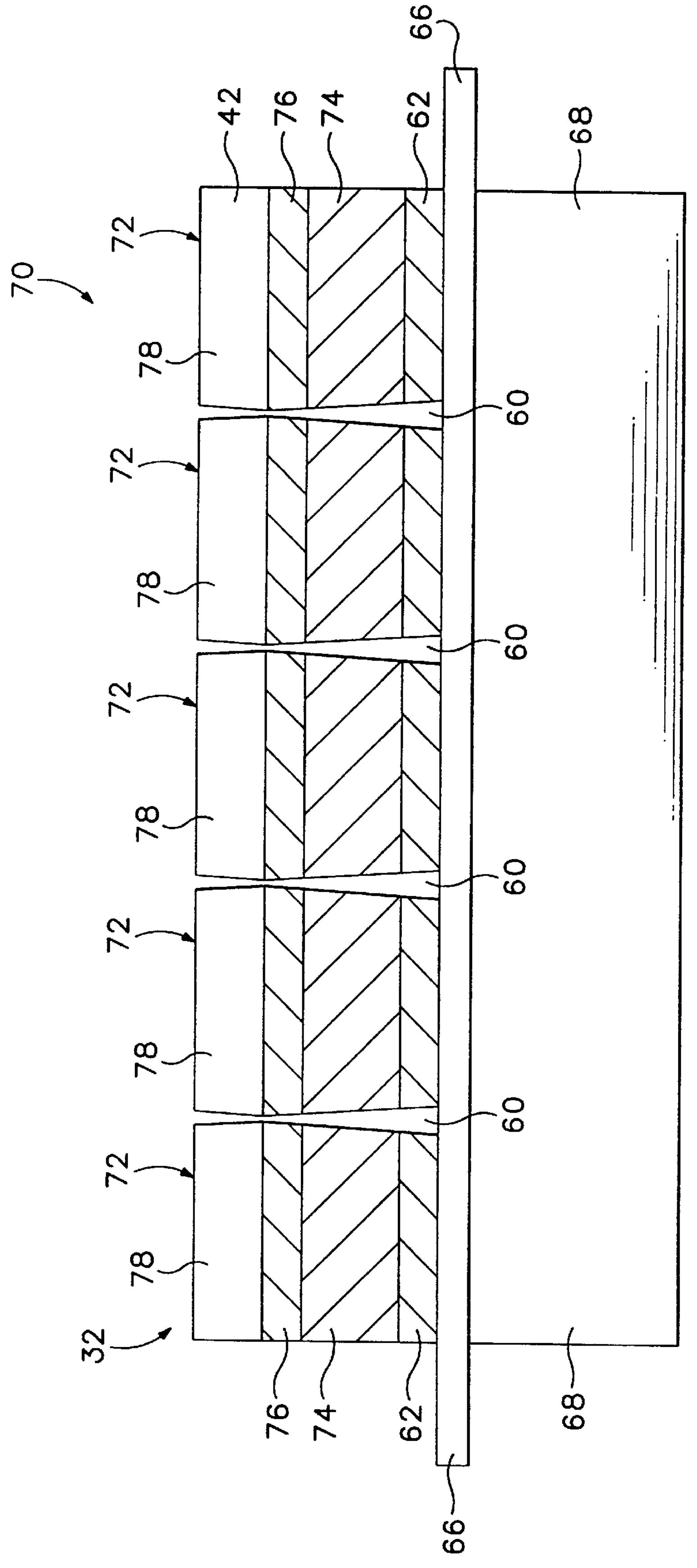
FIG. 7 is a greatly expanded cross-sectional side view of an ultrasound transceiver according to the present invention.

FIG. 7 shows a reoriented side view of workpiece 32. The side shown on top in FIGS. 2*a*–2*b* is now on the bottom and vice versa. In FIG. 7 workpiece 32 has been adhered to an acoustically transparent interconnect substrate 66, which is adhered to an acoustic backing 68. Transceiving layer 42 is machined by frequency quadrupled Nd:YAG laser 28, which is aligned with kerfs 60 through the use of fiducial markings, to ablate through transceiving layer 42 and metal layer 36 to complete each kerf 60 and thereby produce a rectilinear array 70 of rectangular elements 72.

Each rectangular element 72 is comprised of an electrical signal electrode 62, a piezoelectric motor 74, a ground electrode 76 and an element transceiving layer 78. Each rectangular element 72 has the physical characteristic of generally tapering outwardly toward the transceiving side of array 70, maximizing its the transmitting and receiving surface area. Because the distance between the elements is set by the wavelength of sound transmitted and received, the outwardly expanding shape of elements 72 provides for a greater overall transceiving area, permitting the more powerful transmission and more sensitive reception of sound waves.

A plated via is formed at one out of every four prospective kerf intersections. Consequently, each ground electrode 76 is electrically connected to one grounding connector 65. If more ground connectors are desired to provide a more solid and redundant ground, plated vias can be formed on one-half, three quarters, or all of the prospective kerf intersections. The element structure having piezoelectrode motor 74 interposed between electrode 62 and ground electrode 76 permits the polarization of the piezoelectric material after fabrication, should this be necessary.

In the operation of a particular element 72, signal electrode 62 perturbs piezoelectric motor 74 with a pulse of electricity that creates an electrical potential difference between signal electrode 62 and ground electrode 76. A resultant sound wave is transmitted from transceiving layer 78. The echo from this sound wave physically strikes transceiving layer 78, which transmits the sound to piezoelectric motor 74 thereby creating a potential difference between signal electrode 62 and ground electrode 76.

Figure 8A:
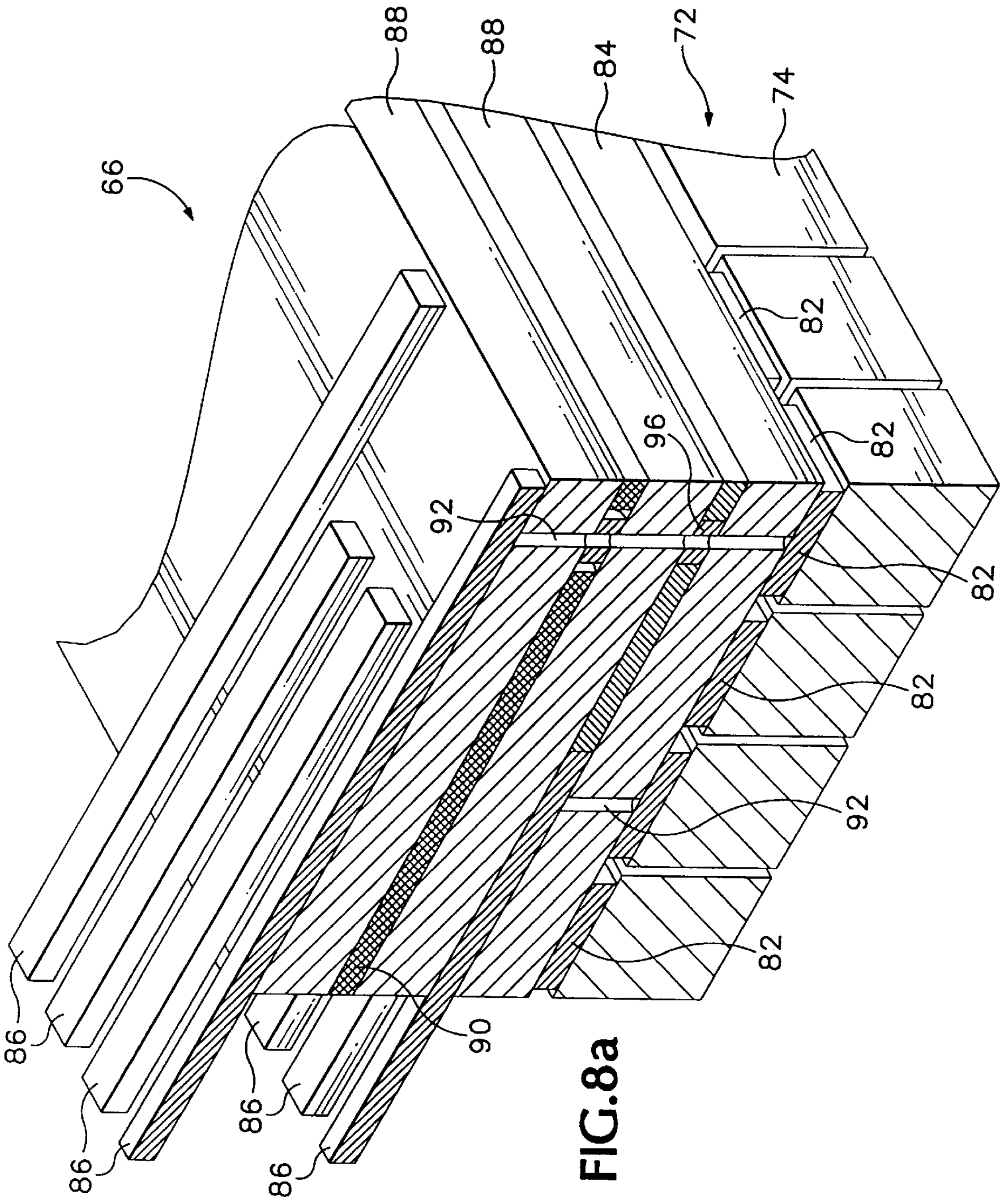
FIG. 8*a* is a greatly expanded partially cross-sectional isometric drawing of an ultrasound transceiver according to the present invention, showing the interconnect structure in greatly expanded form relative to the remainder of the transceiver for ease of description.
Figure 8B:
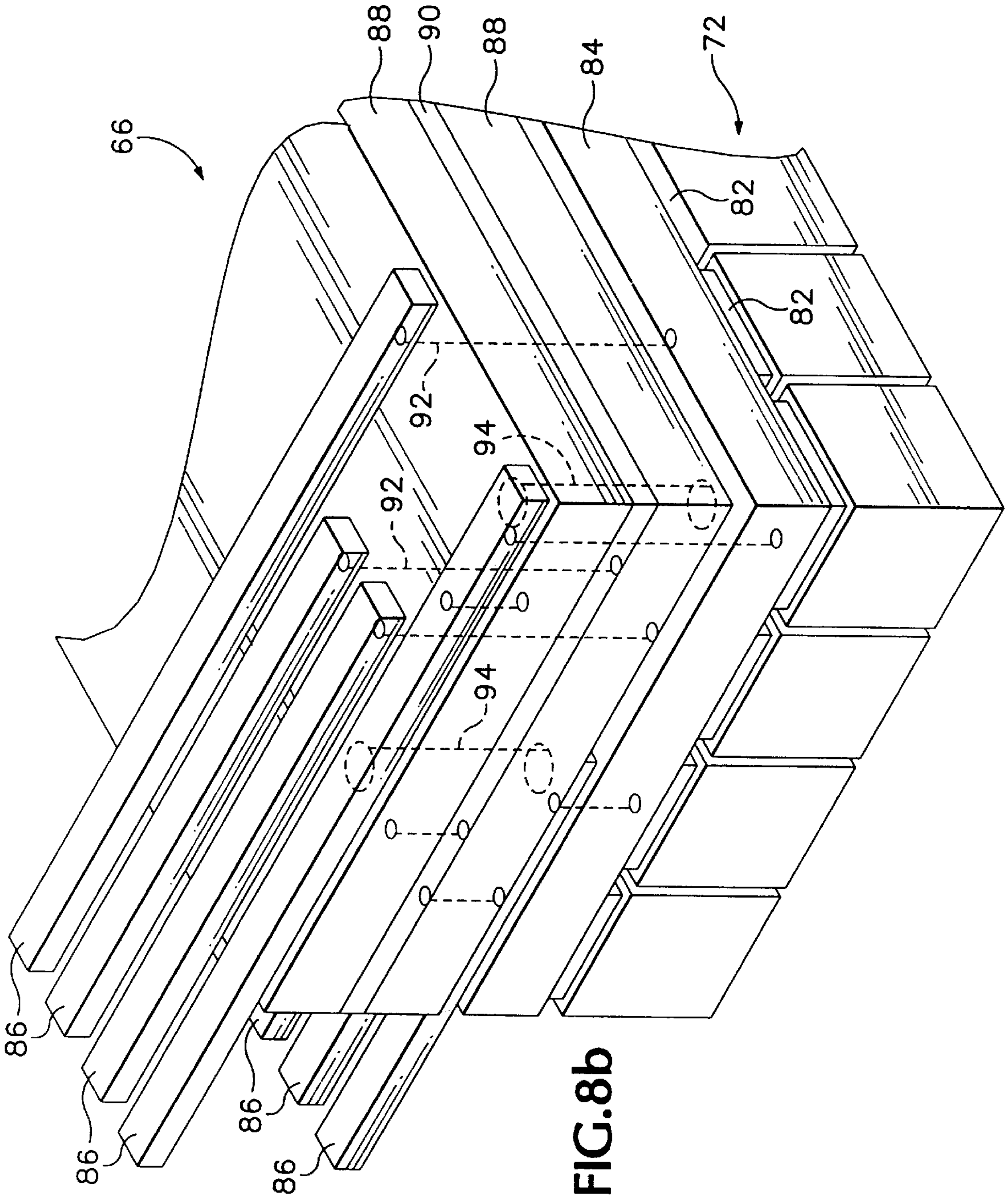
FIG. 8*b* is a greatly expanded isometric drawing of the ultrasound transceiver of FIG. 8*a*, showing the interconnect structure in greatly expanded form relative to the remainder of the transceiver for ease of description.
Figure 8C:
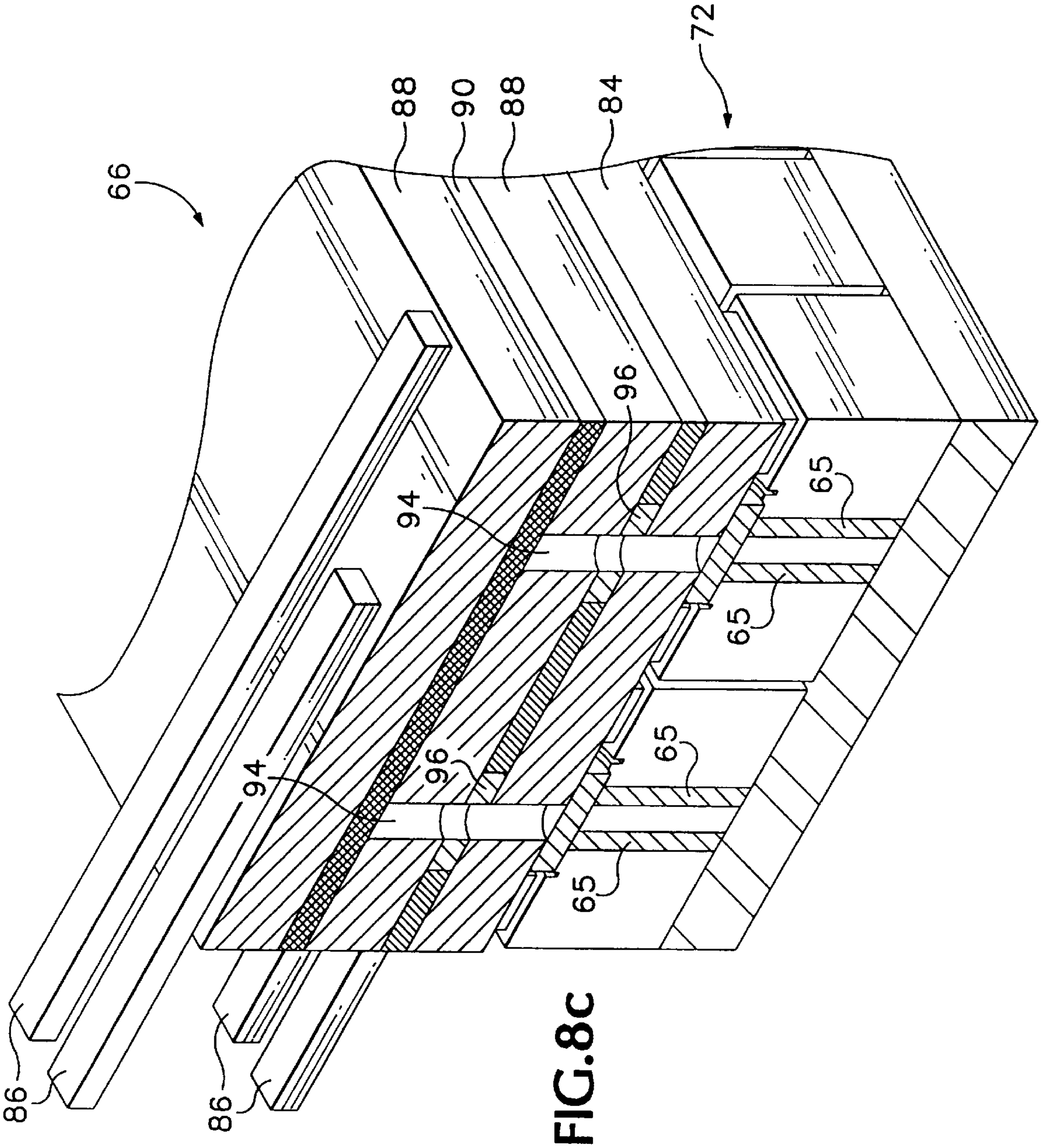
FIG. 8*c* is a greatly expanded partially cross-sectional (at a different cut than FIG. 8*a*) isometric drawing of the ultrasound transceiver of FIG. 8*a*, showing the interconnect structure in greatly expanded form relative to the remainder of the transceiver for ease of description.

In a preferred embodiment shown in FIGS. 8*a*–8*c*, interconnect substrate 66 is comprised of a set of signal pads 82 attached to a first flexible insulative layer 84, preferably made of a polyimide such as Kapto®, which is a product of Dupont Corp. of Wilmington, Del. Multiple sets of signal traces 86 are separated from signal pads 82 by layer 84 and from one another by additional flexible insulative layers 88. In addition, a ground plane 90 is interspersed between two of the additional flexible insulative layers 88. A set of interconnect substrate first plated vias 92 connects each signal trace 86 to a signal pad 82 whereas a set of interconnect substrate second plated vias 94 (FIGS. 8*b* and 8*c*) connect ground plane 90 to each ground connector 65. Plated via contact pads 96 electrically connect the portion of each plated via 92, 94 as it passes from one flexible, insulative layer 84, 88 to the next.

Figure 9A:
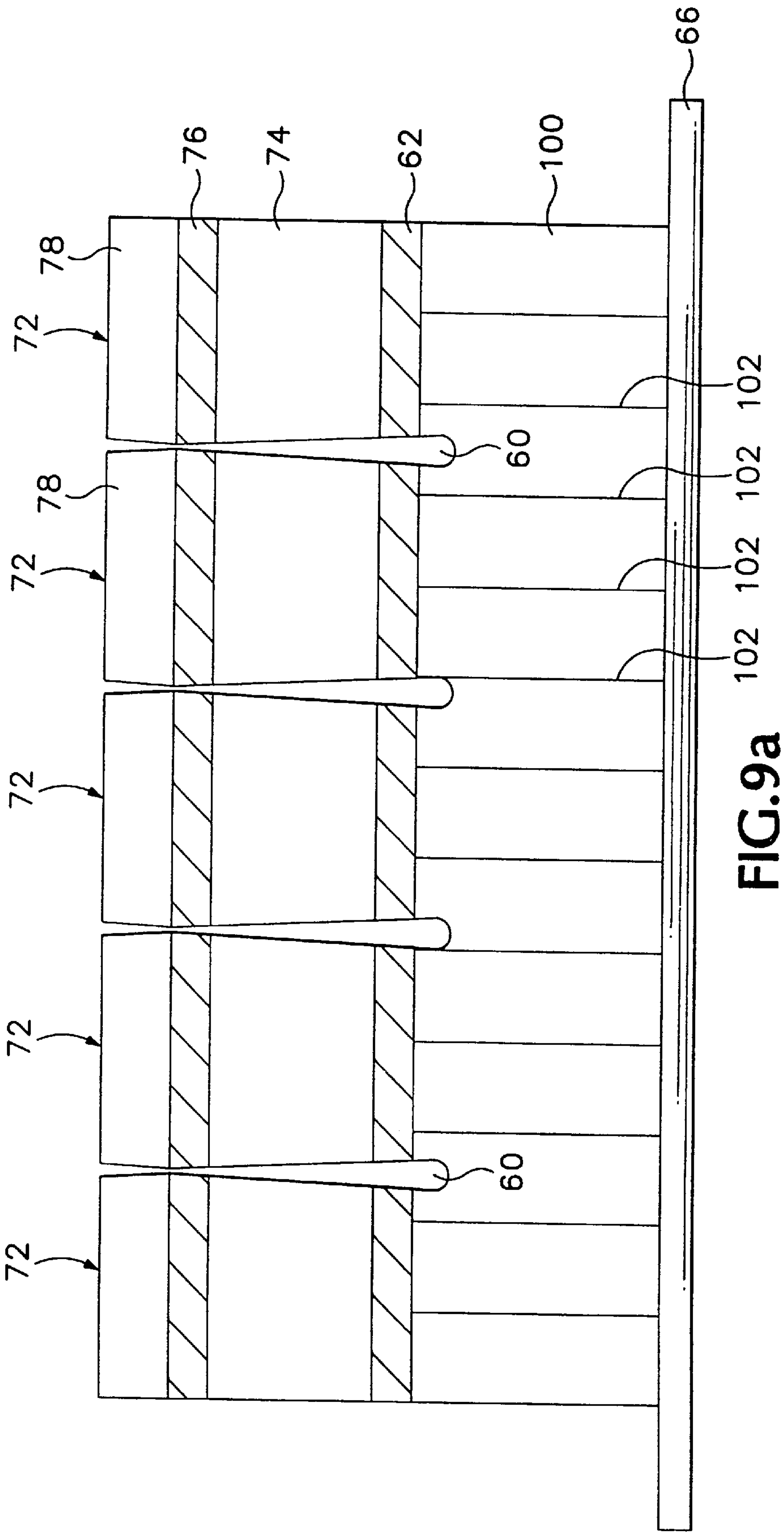
FIG. 9*a* is a greatly expanded side view of an alternative embodiment of the ultrasound transceiver array of the present invention.
Figure 9B:
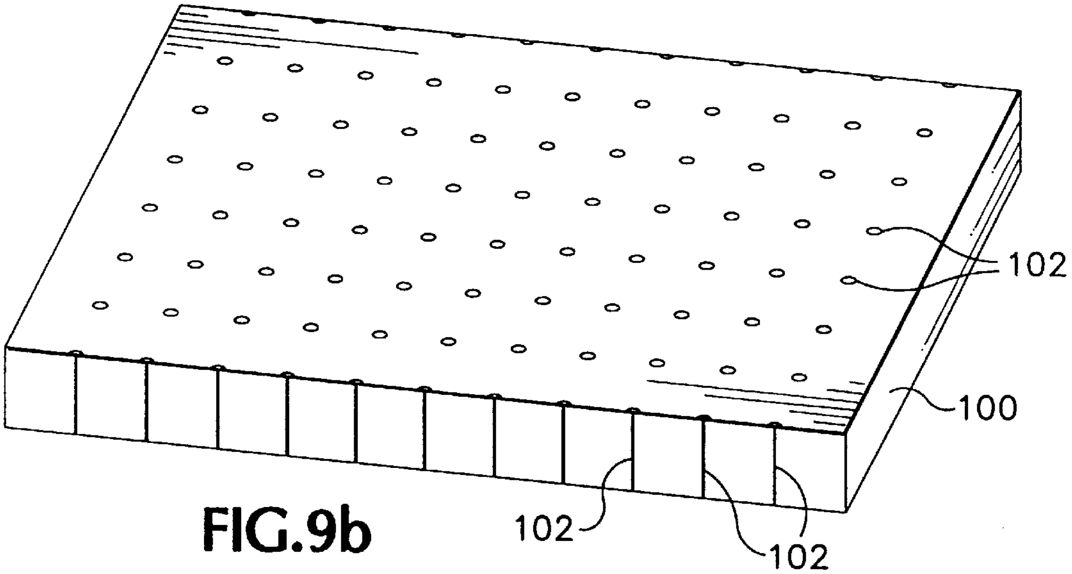
FIG. 9*b* is a greatly expanded isometric drawing of the anisotropically conductive layer shown in FIG. 9*a*.

In an additional preferred embodiment shown in FIGS. 9*a*, array elements 72 are separated from interconnect substrate 66 by an anisotropically conductive, acoustically absorptive layer 100. Kerfs 60 are machined into this layer to further acoustically isolate array elements 72 from one another. A plurality of conducting pillars 102 electrically connect signal electrodes 62 to signal pads 82 (not shown) of interconnect substrate 66. Pillars 102 must be mutually separated by at most half the spacing of array elements 62 to ensure that each element 62 is properly electrically connected to a signal pad 82. FIG. 9*b* is an isometric drawing of the anisotropically conducting layer.

Figure 11:
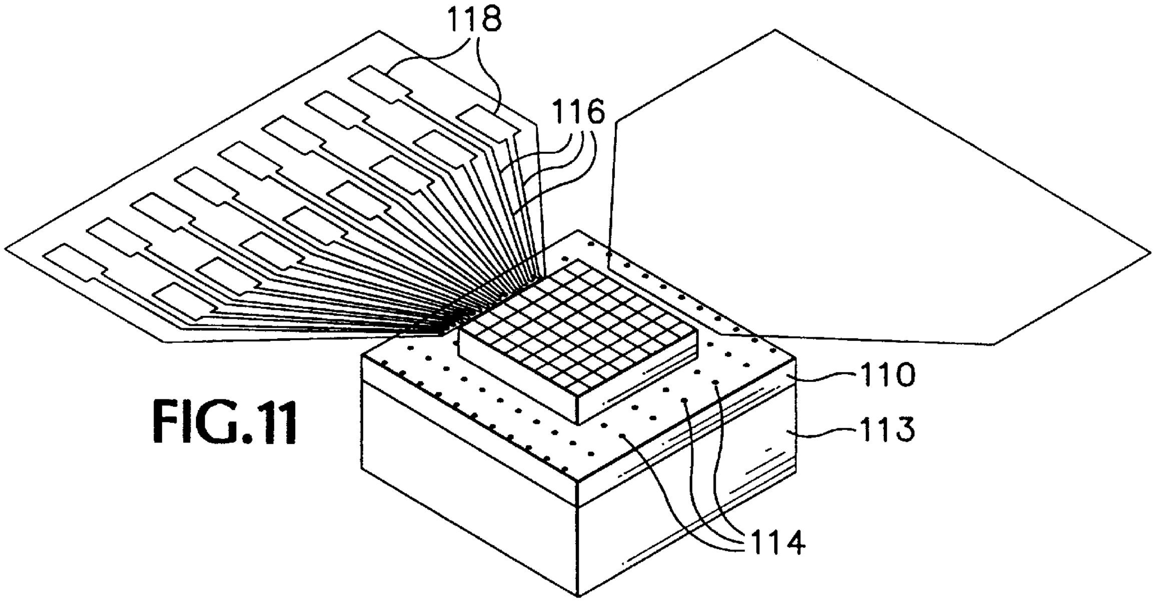
FIG. 11 is a greatly expanded isometric view of the ultrasound transceiver of FIG. 10.
Figure 10:
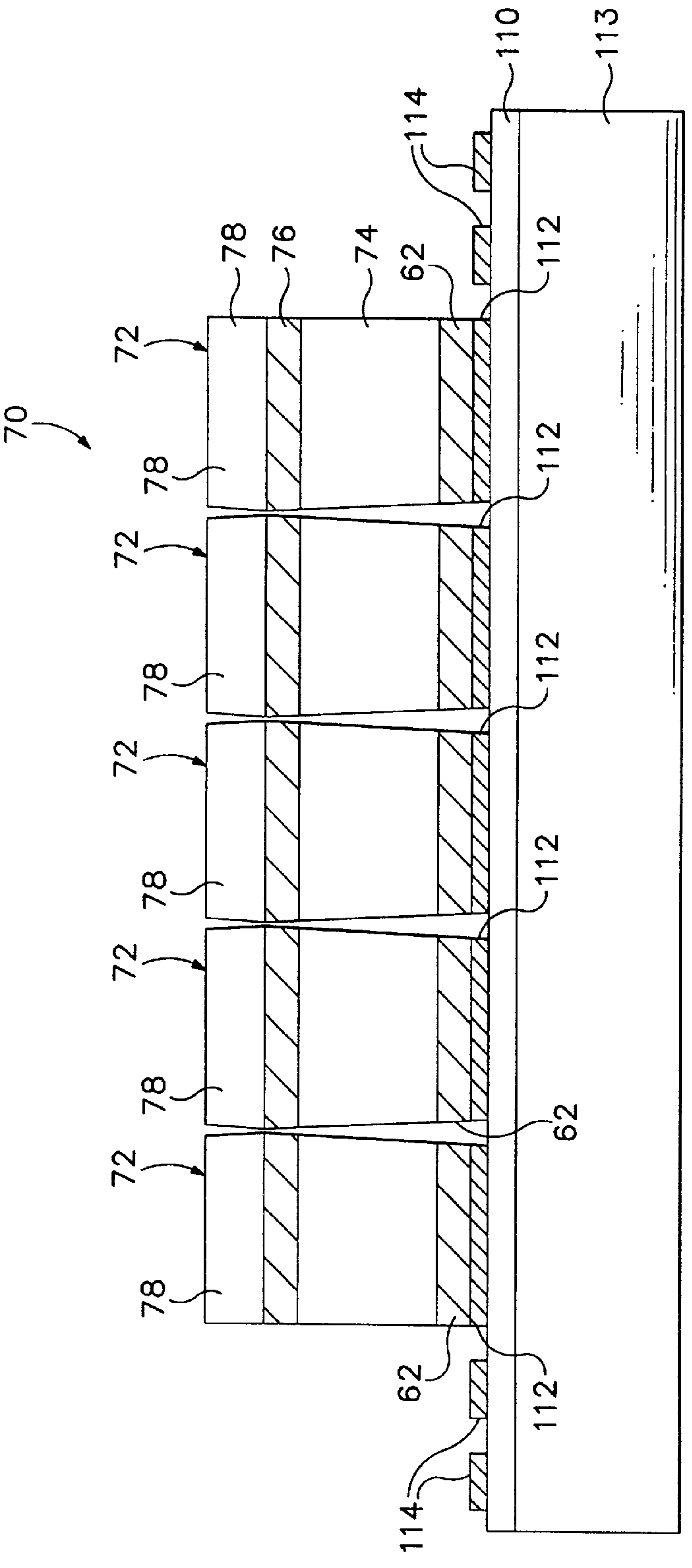
FIG. 10 is a greatly expanded side view of an additional alternative embodiment of the ultrasound transceiver array of the present invention.

In an alternative additional preferred embodiment, shown in FIGS. 10 and 11, array elements 72 are electrically connected to an integrated circuit 110. Integrated circuit 110 includes electrical connecting elements 112 for connection to and aligned with each array element 72. Integrated circuit 110 includes active electrical circuitry, such as an amplifier and a transistor switch for each array element 72. By placing integrated circuit 110 directly adjacent to array elements 72, the transmission line problems, such as cross-talk and reflections are minimized. The amplified signals may be brought out of integrated circuit 110 by a flex circuit having one conductive trace for each element. Alternatively, the amplified signals may be multiplexed and additional processing may be performed, permitting a smaller number of conductive traces.

Integrated circuits in general are made of material e.g. $SiO_2$) which is acoustically similar to piezoelectric ceramic material 34. Therefore, the boundary between integrated circuit 1 10 and array 70 does not create troublesome reflections. By placing the amplifiers that are needed for each element 72 of array 70 into an integrated circuit which is directly attached to array 70, the transmission line length may be reduced to less than a millimeter, greatly improving the signal-to-noise ratio for each element 72 and reducing signal reflections and cross-talk. If greater acoustical isolation is needed an anisotropically conductive layer, such as layer 100 (FIG. 9*a*), may be interposed between array 70 and integrated circuit 110. An acoustic absorptive backing layer 113 prevents reflections from behind integrated circuit 110. A set of electrical contact pads 114 connect integrated circuit 110 with a flex circuit having a multiplicity of traces 116 (FIG. 111) connecting a set of terminals 118 (FIG. 11) to electrical contact pads 114.

Figure 12:
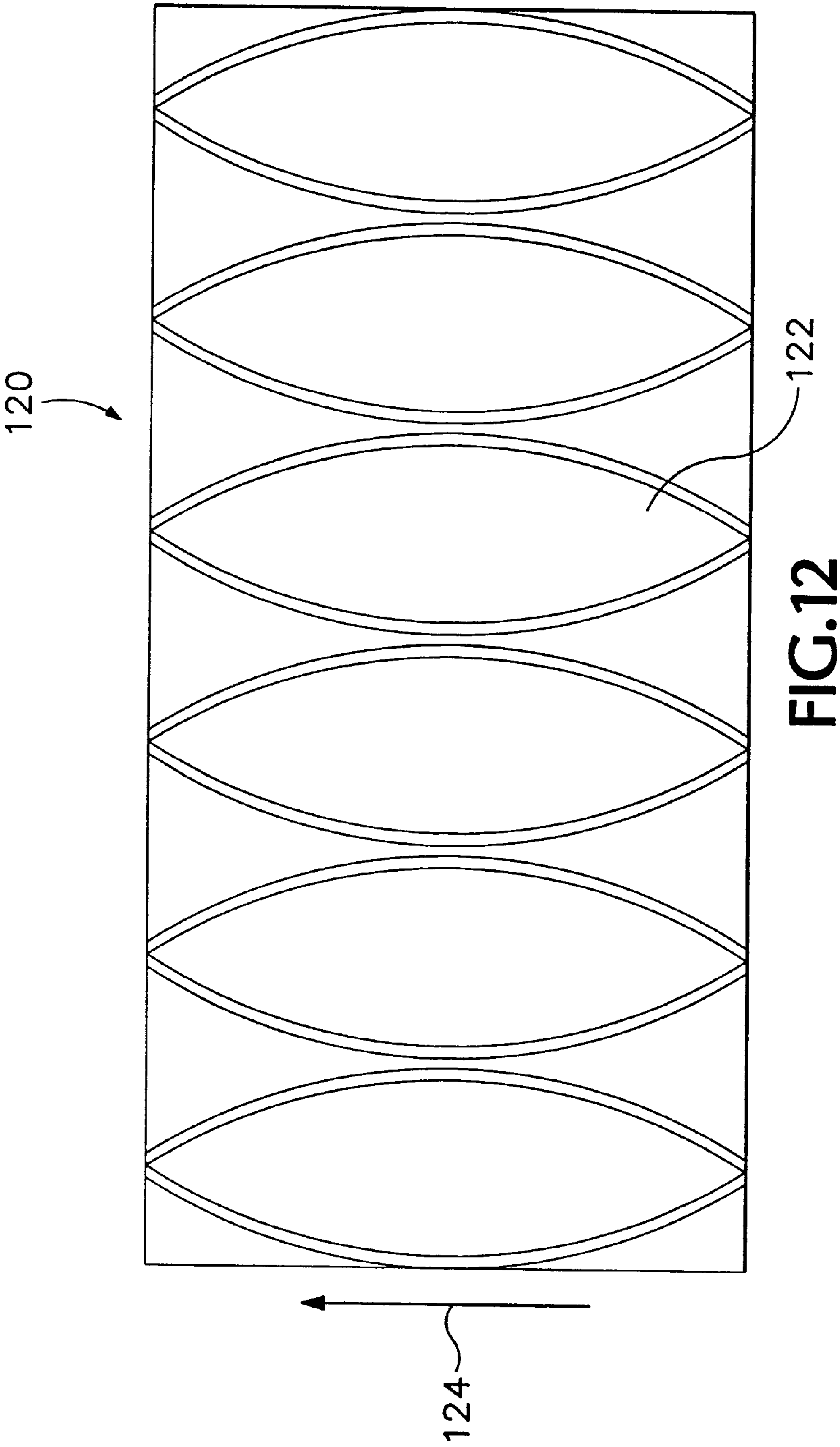
FIG. 12 is a greatly expanded top view of an additional alternative embodiment of the ultrasound transceiver array of the present invention.

An improved one dimensional array 120 is shown in FIG. 12. Nonrectilinear elements 122 focus the beam more precisely in the y-dimension 124, than do linear elements 12 of one dimensional array 10.

It will be obvious to those having skill in the art that many changes may be made to the details of the above-described embodiments of this invention without departing from the underlying principles thereof. The scope of the present invention should, therefore, be determined only by the following claims.

What is claimed is:

1. An ultrasound transceiver array, comprising:

a structure having a set of electrical conductors;

a set of transceiving elements, each made of piezoelectric material, electrically connected to a said electrical conductor and having:

an attached surface fixedly attached to said structure and electrically connected to said electrical conductor;

a transceiving surface opposed to said first surface, said transceiving surface for transmitting and receiving sound waves; and an exterior side surface extending from said transceiving surface to said attached surface and cutting into said piezoelectric material as it extends from said transceiving surface to said attached surface so that said transceiving surface has a greater area than said attached surface and said transceiving elements are spaced closer together, measured from side-to-side, at said transceiving surfaces than at said attached surfaces.

2. The ultrasound transceiver array of claim 1 wherein said structure is an anisotropically conducting, acoustically absorptive layer.

3. The ultrasound transceiver array of claim 2 further including additional transceiving elements and wherein said structure is cut vertically to acoustically isolate said transceiving element from said additional transceiving elements.

4. The ultrasound transceiver array of claim 2 further including an integrated circuit supporting said structure and having active electrical circuitry for controlling each one of said electrically conductive elements.

5. The ultrasound transceiver of claim 1 wherein said structure is an integrated circuit having active electrical circuitry for controlling said electrical conductor.

* * * * *